US011937407B2

(12) United States Patent
Franz et al.

(10) Patent No.: US 11,937,407 B2
(45) Date of Patent: Mar. 19, 2024

(54) PHOTO-ETCHED CHASSIS COOLING WALLS

(71) Applicant: HEWLETT PACKARD ENTERPRISE DEVELOPMENT LP, Houston, TX (US)

(72) Inventors: John Franz, Houston, TX (US); Harvey Lunsman, Chippewa Falls, WI (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 254 days.

(21) Appl. No.: 17/278,514

(22) PCT Filed: Feb. 7, 2019

(86) PCT No.: PCT/US2019/017026
§ 371 (c)(1),
(2) Date: Mar. 22, 2021

(87) PCT Pub. No.: WO2020/162938
PCT Pub. Date: Aug. 13, 2020

(65) Prior Publication Data
US 2022/0039295 A1 Feb. 3, 2022

(51) Int. Cl.
*H05K 7/20* (2006.01)
*H05K 5/04* (2006.01)

(52) U.S. Cl.
CPC .......... *H05K 7/20781* (2013.01); *H05K 5/04* (2013.01); *H05K 7/20272* (2013.01)

(58) Field of Classification Search
None
See application file for complete search history.

(56) References Cited

U.S. PATENT DOCUMENTS 5,057,968 A * 10/1991 Morrison ........... H05K 7/20936
361/802
8,012,808 B2 9/2011 Shi et al.
(Continued)

FOREIGN PATENT DOCUMENTS

AU 2017202585 A1 5/2017
KR 20160145114 A 12/2016

OTHER PUBLICATIONS

Shimifrez Inc., "Shimifrez Inc., A Global Leader in Fabricating Precision Photo Chemically Etched and Electroformed of Micro Metal Components Kicks Offf $750K Expansion, Will Create 8 Jobs, at it's New Facility in Vaughan, Ontario," Mar. 27, 2017, http://prnewswire.com/news-releases/shimifrez-inc.
(Continued)

*Primary Examiner* — Courtney L Smith
(74) *Attorney, Agent, or Firm* — Hewlett Packard Enterprise Patent Department

(57) ABSTRACT

An electronic component enclosure includes a plurality of wall structures defining outer walls of the enclosure. Each wall structure has an internal fluid channel for circulation of cooling fluid. The enclosure further includes at least one partition structure disposed within the outer walls and having an internal fluid channel in sealed fluid communication with the internal fluid channel of at least one of the plurality of wall structures. The internal fluid channel of at least one of the plurality of wall structures and the internal fluid channel of the at least one partition structure defines a continuous fluid circulation path between a fluid inflow port and a fluid outflow port.

18 Claims, 6 Drawing Sheets

(56) References Cited

U.S. PATENT DOCUMENTS

| | | | | |
|---|---|---|---|---|
| 8,587,943 | B2* | 11/2013 | Barina | H01L 23/427 361/720 |
| 9,439,327 | B1* | 9/2016 | Sheng | H05K 7/207 |
| 9,500,416 | B2* | 11/2016 | Nguyen | F28F 3/12 |
| 9,551,538 | B2 | 1/2017 | Honmura et al. | |
| 10,548,243 | B2* | 1/2020 | Kaplun | H05K 7/2039 |
| 10,602,640 | B1* | 3/2020 | Tsai | H05K 7/20254 |
| 10,624,236 | B2* | 4/2020 | Inano | H05K 7/20236 |
| 10,905,031 | B1* | 1/2021 | Gao | G06F 1/184 |
| 11,006,547 | B2* | 5/2021 | Gao | G06F 1/20 |
| 11,470,742 | B2* | 10/2022 | Xue | H05K 7/20872 |
| 2007/0070601 | A1* | 3/2007 | Vos | H05K 7/1404 361/694 |
| 2011/0180235 | A1* | 7/2011 | Garimella | F25B 15/00 165/104.11 |
| 2012/0095268 | A1 | 4/2012 | Tonkovich et al. | |
| 2014/0123493 | A1* | 5/2014 | Campbell | F28F 3/12 29/890.03 |
| 2014/0216686 | A1 | 8/2014 | Shelnutt et al. | |
| 2015/0116938 | A1* | 4/2015 | Nakanishi | B23P 15/26 165/104.11 |

OTHER PUBLICATIONS

Tyrrell, M., "Photo Chemical Etching Can Machine Metals That Conventional Processes Find Too Difficult," Apr. 13, 2018, https://www.aero-mag.com/photo-chemical-etching-can-machine-metals-conventional-processes-find-difficult/.

Vacco Industries, "Photo Etching of Stainless Steel Printed Circuit Heat Exchanger Layers for the Fuel Cell Industry," 2017, https://vacco-etch.com/precision-photo-etching-project-gallery/photo-etching-of-stainless-steel-printed-circuit-heat-exchanger-layers-for-the-fuel-cell-industry/.

Search Report and Written Opinion received for PCT Application No. PCT/US2019/017026, dated Dec. 3, 2019, 10 pages.

* cited by examiner

PHOTO-ETCHED CHASSIS COOLING WALLS

BACKGROUND

Electronic equipment such as computers and related components typically generate thermal energy (i.e., heat) during operation. The amount of heat generated may vary based on many factors, including the number and type(s) of electronic components, the operational state of those components (and hence the power they are consuming), and so on. Excessive temperature, in turn, may have an adverse effect on the performance of electronic components.

BRIEF DESCRIPTION OF THE DRAWINGS

For a detailed description of various examples, reference will now be made to the accompanying drawings, in which.

DETAILED DESCRIPTION

Figure 1:
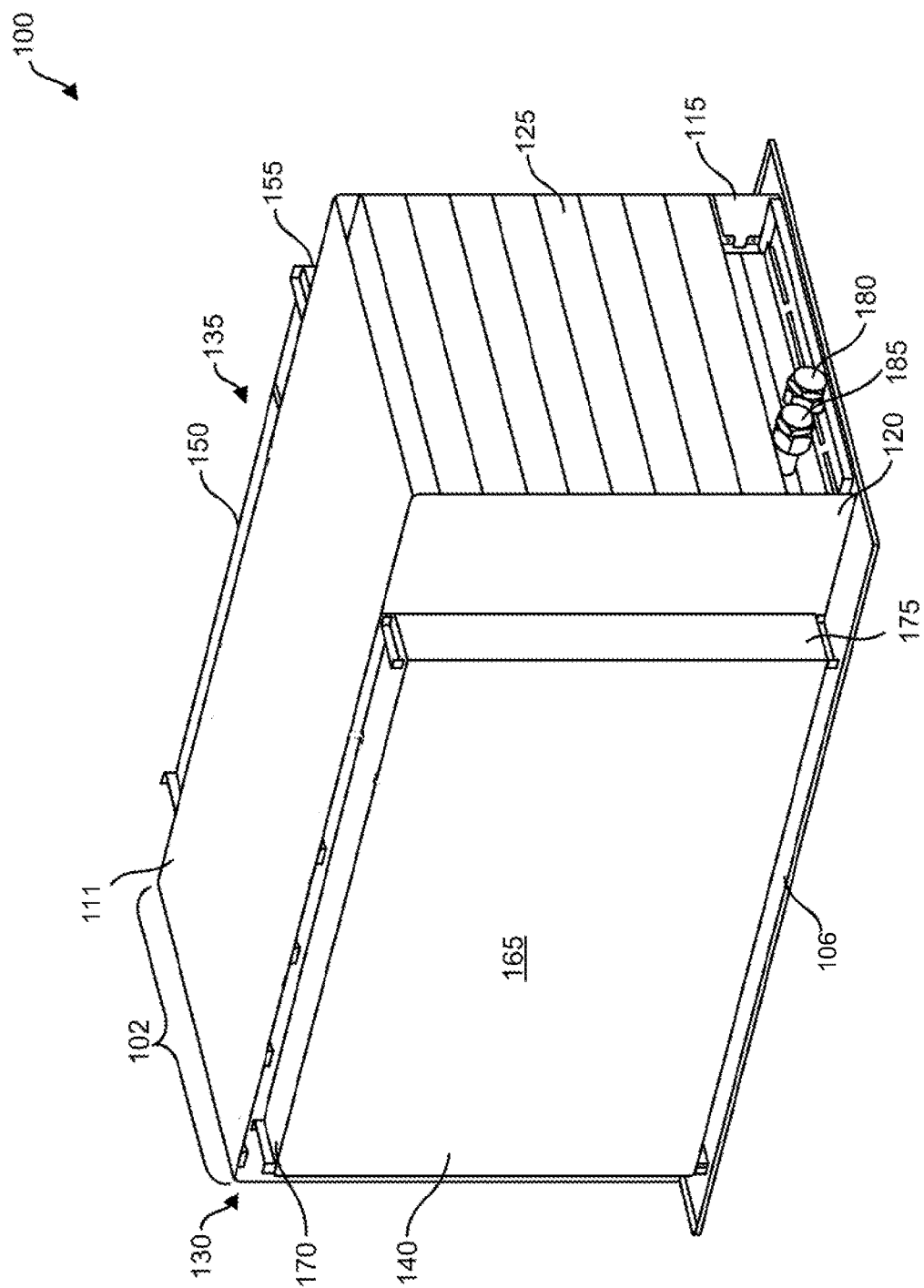
FIG. 1 is a perspective view of an electronic component enclosure assembly in accordance with one or more examples of the present disclosure.

As noted above, the amount of heat generated by electronic components may vary based on many factors, including the number and type(s) of electronic components, the operational state of those components (and hence the power they are consuming), and so on. Electronic components, such as semiconductor microprocessors and memory circuits, may generate substantial amounts of heat during operation. Excessive temperature, in turn, may have an adverse effect on the performance of electronic components.

Often, computers and related electronic components are disposed and arranged within enclosures. Enclosures may provide physical protection for the enclosed components from environmental conditions such as dust and particulate infiltration, moisture, and so on, and may facilitate the efficient mounting and installation of component systems, among other functions. However, because electronic equipment tends to generate heat, provisions must be made to ensure that enclosures do not permit excessive heat to accumulate around the enclosed components, since excessive heating may cause temporary or lasting impairment to the functioning of electronic components. Such provisions include the providing of natural ventilation through enclosures, forced ventilation through the provision of electric fans and the like, and providing other dedicated heat-dissipating components and structures, such as heat sinks, circulating liquid-cooling systems, and even complete immersion of electronic components in dielectric fluids. Different approaches to heat-dissipation of electronic systems may be perceived to have different advantages and disadvantages, in term of their relative costs, complexities, structural limitations, and so on. Dissipation of heat from electronic components and systems such as computers is especially important for high-performance computing (HPC) systems, data and data processing centers, and the like, in which potentially large numbers of electronic systems capable of generating substantial amounts of heat may be located.

In this description, for purposes of explanation, numerous specific details are set forth in order to provide a thorough understanding of the examples disclosed herein. It will be apparent, however, to one skilled in the art that the disclosed example implementations may be practiced without these specific details. In other instances, structure and devices are shown in block diagram form in order to avoid obscuring the disclosed examples. Moreover, the language used in this disclosure has been principally selected for readability and instructional purposes and may not have been selected to delineate or circumscribe the inventive subject matter, resorting to the claims being necessary to determine such inventive subject matter. Reference in the specification to "one example" or to "an example" means that a particular feature, structure, or characteristic described in connection with the examples is included in at least one implementation.

The terms "electronic component" and "electronic device" as used herein are intended to refer broadly and generally to any electrically-powered device or system, including but not limited to computing devices such as microprocessors, memory modules, and any and all related components, which may be disposed and arranged on one or more printed circuit boards (PCBs), electrical power supplies and transformers, and so on, all of which tending to radiate thermal energy (heat) during normal operation.

Heat generation by electronic components may be especially problematic when such devices or systems are disposed within enclosures, as either single devices or systems within dedicated housings, or with equipment possibly comprising multiple components designed to be arranged in racks or cabinets commonly used for such purposes.

Excessive temperatures may diminish the performance of electronic components, and in extreme cases may cause component failure. Heat generation becomes of increasing concern in the context of high performance computing (HPC) and other large-scale data storage or data processing facilities, which may comprise numerous processors and large amounts of electronic memory. In such systems, multiple processor boards, memory units, magnetic and/or solid-state disk drives, power supplies, and/or other electronic components may be deployed and contained within one or more enclosures. It is desirable, therefore, to provide for dissipation of heat away from the immediate surroundings of enclosed electronic components, especially the interiors of enclosures housing such components.

As noted above, various heat dissipation approaches have been implemented, including, for example, heat sinks, air circulation fans (with appropriate ventilation), and liquid-cooled systems in which a cooling fluid, such as water, circulates between a heat source and a heat sink. Some heat dissipation systems involve complete immersion of components in dielectric fluids, such as mineral oil for example. Such approaches may be effective to varying degrees in capturing and conducting or otherwise dissipating some fraction of heat away from the immediate surroundings of the electronic components, such as to the outside of the enclosure containing the electronic components.

There may be trade-offs in the advantages and disadvantages of different approaches to heat capture/dissipation for electronic components. For example, with approaches requiring electronic component enclosures to be ventilated, such as with cooling fans and/or via convection, the existence of ventilation openings may undesirably decrease the ability of the enclosure to protect the electrical components from external mechanical/physical conditions. Ventilated openings in an enclosure may permit infiltration of dust and other particulates, and may not protect internal components from high humidity or other undesirable environmental conditions besides temperature. Electric fans employed to promote heat-dissipating air circulation themselves consume power (thus potentially contributing to the generating of heat), and constitute an additional system component consuming power, requiring maintenance, and being subject to potential mechanical failure. Noise generation may also be of concern.

Liquid-cooled systems employing dedicated heat-capturing structures such as cold plates, coupled to heat-exchanging cooling fluid loops, may be effective in capturing heat from electronic components and conducting the heat to a heat exchanger or the like outside of the immediate environment of the components and their enclosures. These dedicated heat-capturing structures must be designed and configured to be disposed either in direct contact with specific heat-generating electronic components, or in sufficiently close proximity to such components that they are capable of capturing an appreciable amount of the heat generated from the areas that surround the high powered devices such as CPU, DIMM or HCA (host card adapter). Such dedicated structures occupy valuable space within the enclosures, add undesirable weight to the enclosures, and must each be incorporated into a cooling fluid circulation loop with dedicated plumbing and fluid connections. Moreover, the presence of liquids, such as water, circulating in close proximity to electronic components may be considered undesirable due to the risk of fluid leakage.

A problem may also arise in large-scale data storage and/or data processing centers, which may include HPC systems comprising large numbers of enclosures in a single space, such as a room or a building, which in turn may also be enclosed. Although heat may be effectively transferred to the outside of individual enclosures using techniques such as described above, the combined heat of a number of enclosures in a common enclosed space may lead to undesirable ambient thermal conditions within the common space itself. This, in turn, may necessitate further accommodations to be made, such as providing powerful and costly HVAC air conditioning and/or air exchange systems to maintain desired temperature and humidity conditions in the larger surrounding environment.

Thus, it may be desirable to provide an enclosure for electronic components or systems which is capable of capturing all or substantially all of the heat generated by the enclosed electronic components and conducting the heat to an exterior location, for example, to a heat exchanger. It may also be desirable to not add weight or increase system size due to accomplish the heat capture, It may also be desirable to provide a completely sealed enclosure so as to eliminate the infiltration of dust, humidity, and the like into the enclosure. A fully sealed system allows for a wider customer adoption by enabling a more flexible deployment choice agnostic of many environmental restrictions.

Referring to FIG. 1, there is shown a perspective view of an electronic component enclosure assembly 100 according to one example. Enclosure assembly 100 in FIG. 1 includes an exterior casing having a top portion 111 a rear portion 113, first and second side portions 115 and 120, and first and second end portions 125 and 130. As described herein, the exterior casing encloses and protects a substantially sealed enclosure 102. As used herein, the descriptor "substantially sealed" refers to an enclosure which does not allow for the exchange of air between the exterior of the enclosure and the interior of the enclosure. In this illustrative example, main enclosure 102 may have dimensions of approximately 24 inches in width, 20 inches in height, and 40 inches in length.

In the example of FIG. 1, enclosure assembly 100 further consists of first and second auxiliary enclosures 135 and 140. Auxiliary enclosure 135 includes an auxiliary side casing 145 (not visible in the view of FIG. 1), an auxiliary top casing 150, an auxiliary end casing 155 and an opposing auxiliary end casings (not visible in the view of FIG. 1). Auxiliary enclosure 140 includes an auxiliary side casing 160, an auxiliary top casing 165, an auxiliary end casing 170 (and an opposing auxiliary end casing not visible in the view of FIG. 1).

With continued reference to FIG. 1, enclosure assembly 100 is provided with a cooling fluid inflow port 180 and a cooling fluid outflow port 185. These ports 180, 185 enable enclosure assembly 100 to be coupled a fluid-cooling circulation loop as hereinafter described. In the example of FIG. 1, ports 180 and 185 are both shown situated generally near the bottom of enclosure assembly 100. In an alternative examples, inflow port 180 may be situated as shown while outflow port 185 is situated at or near the top of enclosure assembly. In still other examples, more than one inflow port 180 and/or outflow port 185 may be provided to facilitate fluid flow.

Figure 2:
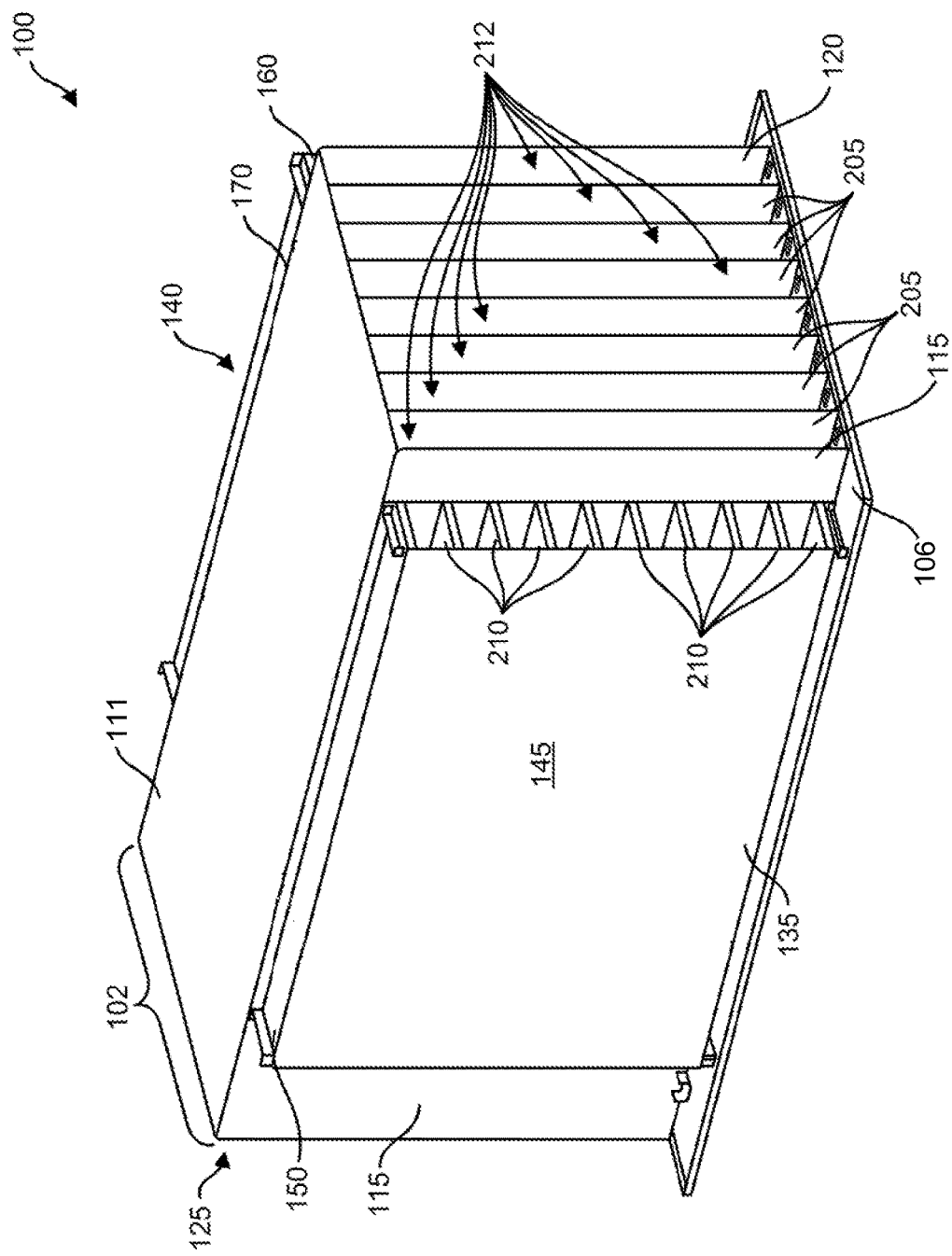
FIG. 2 is another perspective view of the electronic component enclosure assembly from FIG. 2.

FIG. 2 is another perspective view of enclosure assembly 100 from FIG. 1. In FIG. 2, enclosure assembly 100 is rotated 180° with respect to the orientation of FIG. 1; also, in the view of FIG. 2, an end wall opposite end casing 155 for auxiliary enclosure 135 is not shown, in order to expose to view internal structure of auxiliary enclosure, and end casing 130 of main enclosure 102 is not shown, in order to expose to view internal elements of enclosure assembly 100.

As shown in FIG. 2, a plurality of internal partition structures 205 extend within main enclosure 102. In this example, partition structures 205 have dimensions substantially conforming to the volume defined within the wall structures. Partition structures 205 may define one or more internal compartments 212 within main enclosure 102, as hereinafter described. As also shown in FIG. 2, a plurality of partition structures 210 are provided within the space defined by auxiliary enclosure 135, with partition structures 210 defining a plurality of internal compartments within auxiliary enclosure 135. (It is to be understood that a similar plurality of partition structures, not shown, may be provided within the space defined by auxiliary enclosures 135 and 140.)

Figure 3:
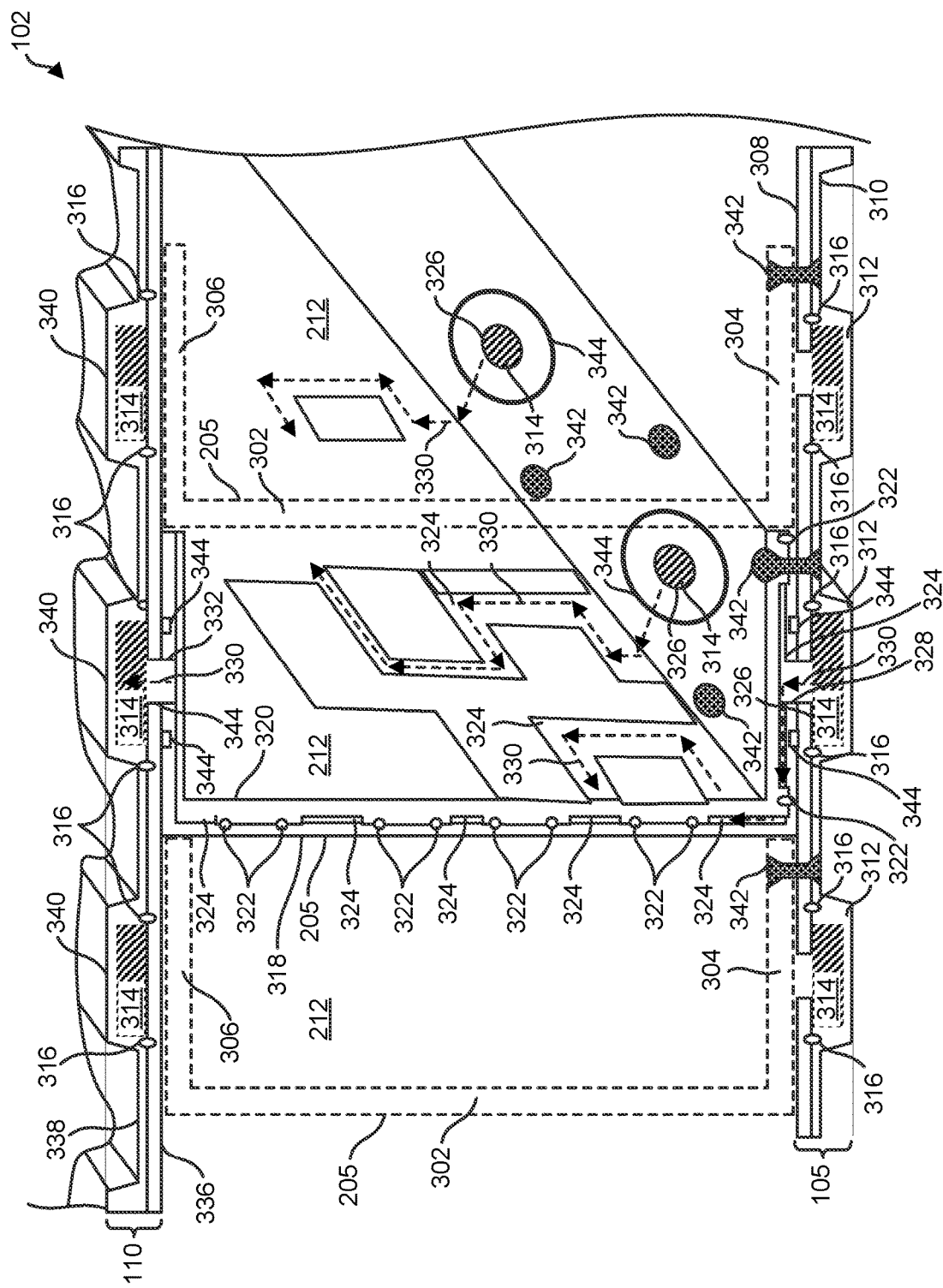
FIG. 3 is a side perspective view of a portion of the electronic component enclosure assembly from FIG. 1.

Turning to FIG. 3, there is shown a perspective end view of a portion of enclosure assembly 100 including a portion of main enclosure 102. It is to be noted that FIG. 3 is not to scale, and neither top casing 111 nor pan 106 is shown, for the purposes of clarity. As shown in FIG. 3, each partition structure 205 comprises a substantially planar portion 302 extending between bottom wall structure 105 and top wall structure 110 of main enclosure 102, collectively defining the plurality of compartments 212 within main enclosure 102. In addition, each partition structure 205 integrally includes a bottom attachment portion 304 for attachment of partition structure 205 to bottom wall structure 105 and a top attachment portion 306 for attachment of partition structure 205 to top wall structure 110.

FIG. 3 shows that bottom wall structure 105 is a laminar structure comprising a lamination of an upper layer 308 and a lower layer 310. In this example, upper and lower layers 308 and 310 are both made of steel, although other metals and materials having suitable thermal conductivity, corrosion resistance, and mechanical strength may be employed. As shown in FIG. 3, lower layer 310 of bottom wall structure 105 is formed so as to define a plurality of inflow channels 312 between lower layer 310 and substantially planar upper layer 308. Inflow channels 312 are configured to be in sealed, fluid communication with fluid inflow port 180, shown in FIG. 1, such that cooling fluid 314 (e.g., water) may be directed into and circulated through enclosure assembly 100. In one example, inflow channels are formed in lower layer 310 by means of mechanical deformation of the material.

In order to maintain a sealed fluid circulation path through enclosure assembly 100, welding, brazing, diffusion bonding, adhesives, or other suitable connection methods may also be used to seal upper layer 308 to lower layer 310 of bottom wall structure 105. This is represented by welding joints 316 in FIG. 3.

Each partition structure 205, including each substantially planar portion 302, lower attachment portion 304, and upper attachment portion 306, includes at least one internal fluid channel providing a path for circulation of cooling fluid through the structure 205. In this example, each partition structure 205 is a laminar structure comprising at least an outer layer 318 and an inner layer 320. Both layers 318, 320 may be made of steel, although other metals or materials of sufficient thermal conductivity, corrosion resistance, and mechanical strength may be employed. Outer layers 318 and inner layers 320 are joined together via welding, diffusion bonding or other suitable connection methods to form a laminated, substantially uniform sealed structure. Outer layers 318 and inner layers 320 are present in each portion 302, 304, and 306 of each partition structure 205. Continuous, permanent, connections, such as by welding, diffusion bonding, etc.) between outer layer 318 and inner layer 320 are designated with reference numerals 322 in FIG. 3.

In this example, one (or both) of layer 318 and inner layer 320 of each laminar partition structure 205 is fabricated so as to define sealed fluid circulation paths between outer layer 318 and inner layer 320. In one example, a layer such as layer 320 is photo-etched to remove material in a pattern defining at least one fluid circulation channel providing for fluid circulation between layers 318 and 320. Fluid circulation channels are designated with reference numerals 324 in FIG. 3. As with the two layers 308 and 310 of bottom wall structure 105, outer layer 318 and inner layer 320 of each partition structure may be fused together by any suitable means, such as welding, diffusion bonding, etc., such that circulation channels 324 are sealed to ensure no escape of cooling fluid circulating through partition structures 205.

Photo-etching is a proven technique for photochemically forming features in metal (or other materials) in a highly precise and repeatable manner. In this example, each section 302 of partition structures 205 may be on the order of 0.02 inches thick, with each outer layer and inner layer comprising approximately one-half of the total thickness. These dimensions are exemplary only, and the dimensions of particular implementations may be different. (And again, it is noted that FIG. 3 is not to scale.) The example shows however that heat-capturing partition structures 205 may be incorporated without occupying more volume within main enclosure 102 than would be occupied by conventional structures found in such enclosures, and without substantially increasing the weight of main enclosure 102 as compared with heat-dissipating structures not having fluid circulation channels defined therein.

Using photo etching techniques, circulation channels 324 may be formed by etching a portion of the thickness of one or both of the outer layers 318 and inner layers 320 of partition structures 205. Outer layers 318 and inner layers 320 may then be diffusion bonded, vacuum brazed, or otherwise joined together by suitable means to ensure that circulation channels 324 are fluid-tight.

In this example, for each partition structure 205, cooling fluid 314 is conveyed from inflow channels 312 defined in bottom wall 105 through an inflow port 326 formed in upper layer 308 of bottom wall 105 which are in turn aligned with ports 328 defined in outer layer 318 of partition structure 205. In one example, pattern 402 is formed in one or more layers of laminar structures, such as wall structures 105, 110, 115, 120, 125, and 130 and one or more partition structures 205 by a photo-etching process capable of partially removing material from the desired layers in a precise and repeatable manner.

Figure 4:
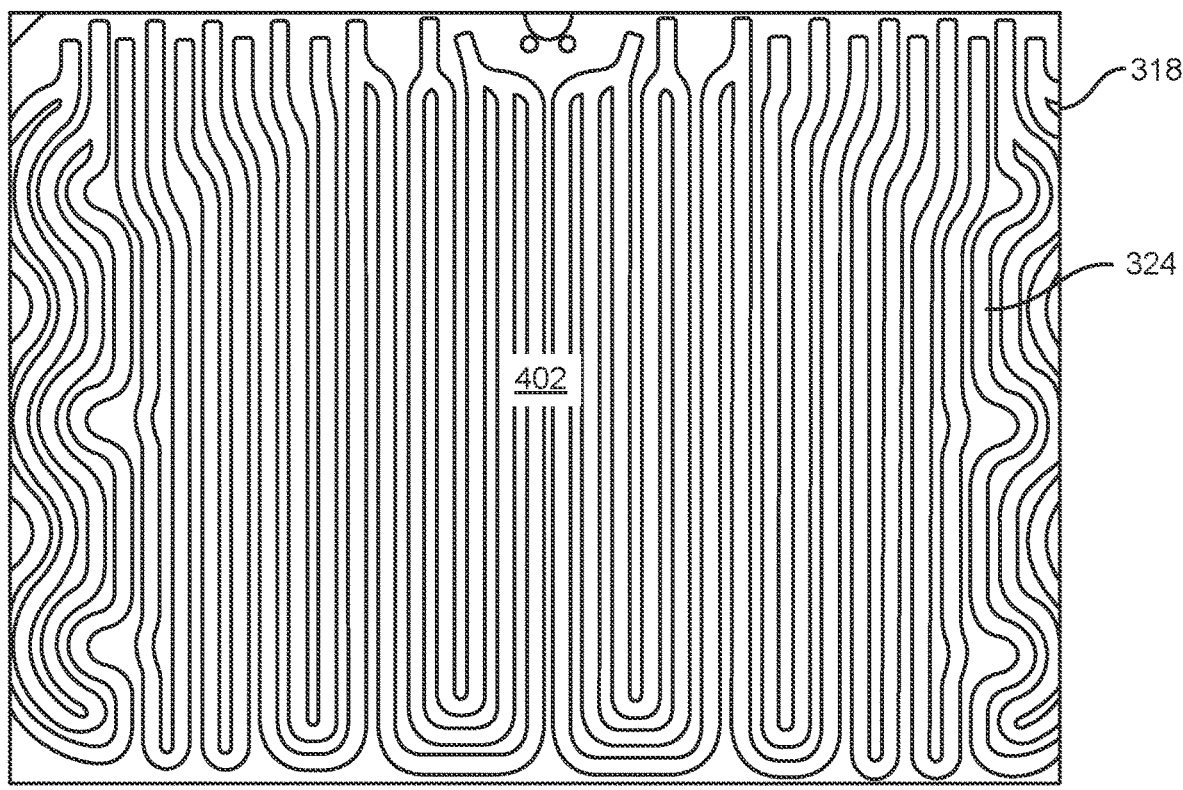
FIG. 4 depicts a cooling fluid circulation path defined within a partition structure of an electronic component enclosure assembly in accordance with one or more examples of the present disclosure.

An example of a pattern 402 for establishing cooling fluid circulation channels 324 within a partition structure 205, and in particular, in a substantially planar portion 302 of a partition structure, is shown in FIG. 4.

In FIG. 3, dashed lines 330 show circulation paths for fluid 314 from inflow channel 314, through ports 326 and 328, and through partition structures 205. At upper attachment portion 306 of each partition structure 205, fluid 314 passes through an outflow port 332 in outer layer 318 of partition structure 205 and a corresponding outflow port 334 in a lower layer 336 of enclosure top wall structure 110.

Fluid 314 passing through ports 332 and 334 as just described is collected in outflow channels 340 defined between upper layer 338 and lower layer 336 of top wall structure 110.

Top wall structure 110 is configured in substantially the same way as bottom wall structure 105, with a lower layer 336 and an upper layer 338 defining at least one sealed fluid outflow channels 340. For example, fluid outflow channels 340 may be formed by mechanical deformation of upper layer 338. Upper and lower layers 336 and 338 of top wall structure 110 may be bonded in the same manner as upper and lower layers 308 and 310 of bottom wall structure 105. This bonding may be accomplished through diffusion bonding techniques, for example, and further may involve additional welding joints 316, as shown in FIG. 3. Outflow channels 340 defined within top wall structure 110 are in fluid communication with cooling fluid outflow port 185, previously described with reference to FIG. 1, to allow circulation of fluid through at least one continuous cooling fluid flow path defined by one or more wall structures 105, 110, 115, 120, 125, and 130 and one or more partition structures 205 of enclosure assembly 100, between inflow port 180 and outflow port 185.

As shown in FIG. 3, the plurality of partition structures 205 may be provided within main enclosure 102. In the present example, the combined heat-capturing surface area of the various components having fluid circulation paths defined therein, including wall structures 105, 110, 115, 120, 125, and 130 as well as partition structures 205, promotes the thermal capturing performance of the enclosure assembly as a whole, making it possible to implement an enclosure assembly 100 as a substantially sealed enclosure. It is contemplated that although enclosure 102 is substantially sealed, in one example, one or more internal fans may nonetheless be provided to improve internal air circulation and thereby enchance the heat-capturing capability within enclosure 102.

Partition structures 205 may be attached to bottom wall structure 105 with fasteners of any suitable type (e.g., threaded fasteners, rivets, etc.). In the example of FIG. 3, a plurality of rivets 342 are shown, at locations where no circulation path 324 is present between upper layer 308 and lower layer 310 of bottom wall structure 105, to ensure the integrity of the sealed cooling fluid circulation loop. Rivets 342 secure each partition structure 205 to bottom wall structure 105 to ensure a fluid-tight connection therebetween. To further ensure the integrity of the cooling fluid circulation loop, O-rings 344 may be provided as shown in FIG. 3. Similar connections with rivets 342 and O-rings 344 may be made between the upper attachment portions 306 of partition structures 205 and top wall structure 110.

Referring again to FIGS. 1 and 2, in one example, enclosure assembly 100 includes auxiliary enclosures 135 and 140, each having a plurality of partition structures 210 therein. In this example, auxiliary enclosures 135 and 140 may serve to house a plurality of power supply units (PSUs) providing operating power to electronic components such as processing units and memory units, housed within main enclosure 102.

In this example, auxiliary enclosures 135 and 140 may be constructed substantially in accordance with main enclosure 102 as herein disclosed. This may include providing auxiliary enclosure side wall structures 145 and 165, auxiliary enclosure top wall structures 150 and 170, and the respective auxiliary enclosure end wall structures in the form of laminated heat-capturing laminar panels substantially similar to side wall structures 110 and 115 and partition structures 205 described herein with reference to FIGS. 1-4. Fluid-circulating paths formed in these structures may be introduced into the cooling fluid circulation loop entering and exiting enclosure assembly 100 through cooling fluid inflow port 180 and outflow port 185.

In one example, operation of enclosure assembly 100 proceeds as follows: Lower-temperature (i.e., cooled or chilled) cooling fluid 314, such as water, is provided at cooling fluid inflow port 180. The incoming cooling fluid may be supplied, for example, from a heat exchange unit. Fluid inflow port 180 is in fluid communication with inflow channels 312 formed in bottom wall 105 of assembly 100. The cooled fluid 314 follows a circulation path extending within one or more partition structures 205 between bottom wall structure 105 and top wall structure 110. As cooling fluid traverses this circulation path, it captures heat within enclosure assembly 100. Part of the circulation path involves an attachment portion 304 of the one or more partition structures 205 for establishing a fluid-tight seal between partition structures 205 and bottom wall structure 105. Another part of the circulation path involves an attachment portion 306 of the one or more partition structures 205 for establishing a fluid-tight seal between partition structures 205 and top wall structure 110. Cooling fluid 314 flows into outflow channels 340 defined in top wall structure 110. Outflow channels 340, in turn, are in fluid communication with cooling fluid outflow port 185, from which cooling fluid that captures heat within enclosure assembly 100 is re-circulated to a heat exchange unit, where the heat captured along the fluid circulation path may be extracted.

Figure 5:
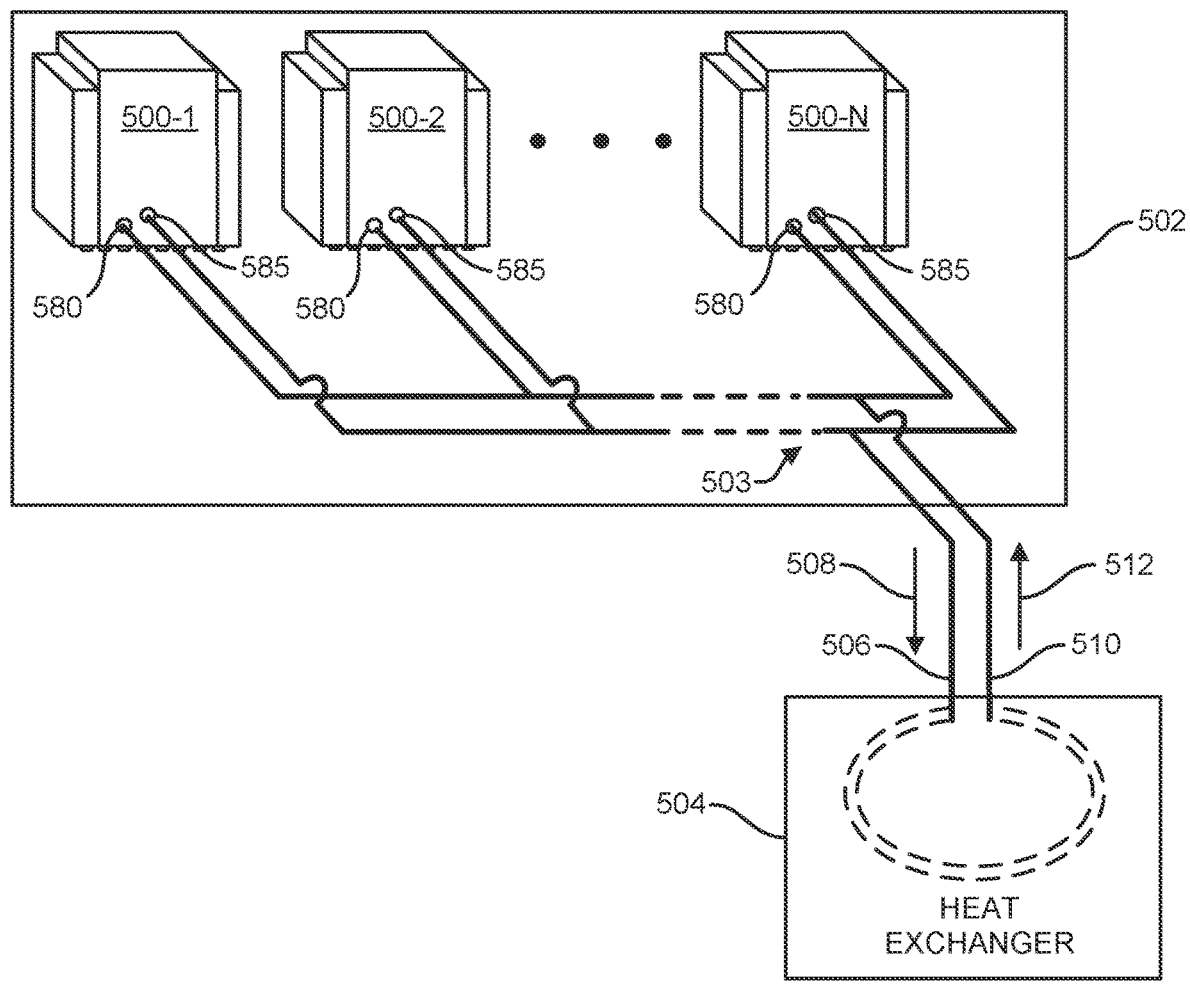
FIG. 5 is a block diagram illustrating deployment of a plurality of electronic component enclosure assemblies in accordance with one example.

FIG. 5 is a schematic/block diagram illustrating an example of deploying a plurality of electronic component enclosures such as enclosure assembly 100 from FIG. 1. In the example of FIG. 5, a plurality of heat-capturing enclosure assemblies, 500-1, 500-2, . . . 500-N (collectively, enclosure assemblies 500) are deployed in a common environment 502, which may be a data or data processing center or the like. Common environment 502 may be of essentially any size, ranging from a single room to an entire building.

As shown in FIG. 5, each enclosure assembly 500 each is provided with a cooling fluid inflow port 580 and a cooling fluid outflow port 585, corresponding substantially as described with reference to cooling fluid inflow port 180 and outflow port 185 for the above-described enclosure assembly 100. With ports 580 and 585, enclosure assemblies 500 are incorporated into a cooling fluid circulation loop 503 which also includes a heat exchanger 504.

Heat exchanger 504 is adapted to receive heated cooling fluid, such as water, at a fluid input 506 and utilize any of many known methods for extracting heat from the fluid, the heated input fluid being directed as indicated by arrow 508 in FIG. 5. After heat exchange, the circulation loop 503 continues with the now-cooled fluid being returned via a fluid output 510, with fluid flow as indicated by arrow 512 in FIG. 5. Cooled fluid returns to environment 502 and is thereafter distributed to cooling fluid inflow ports 585 of enclosure assemblies 500.

With the objective of attaining room (external to enclosure 100/500) environment thermal neutrality for enclosure assemblies 500 while electronic components are operating therein, the fluid connections comprising any part of the circulation loop 503 which are inside environment 502 may be provided with suitable thermal insulation, thereby preventing or minimizing the transfer of the captured heat into environment 502.

Figure 6:
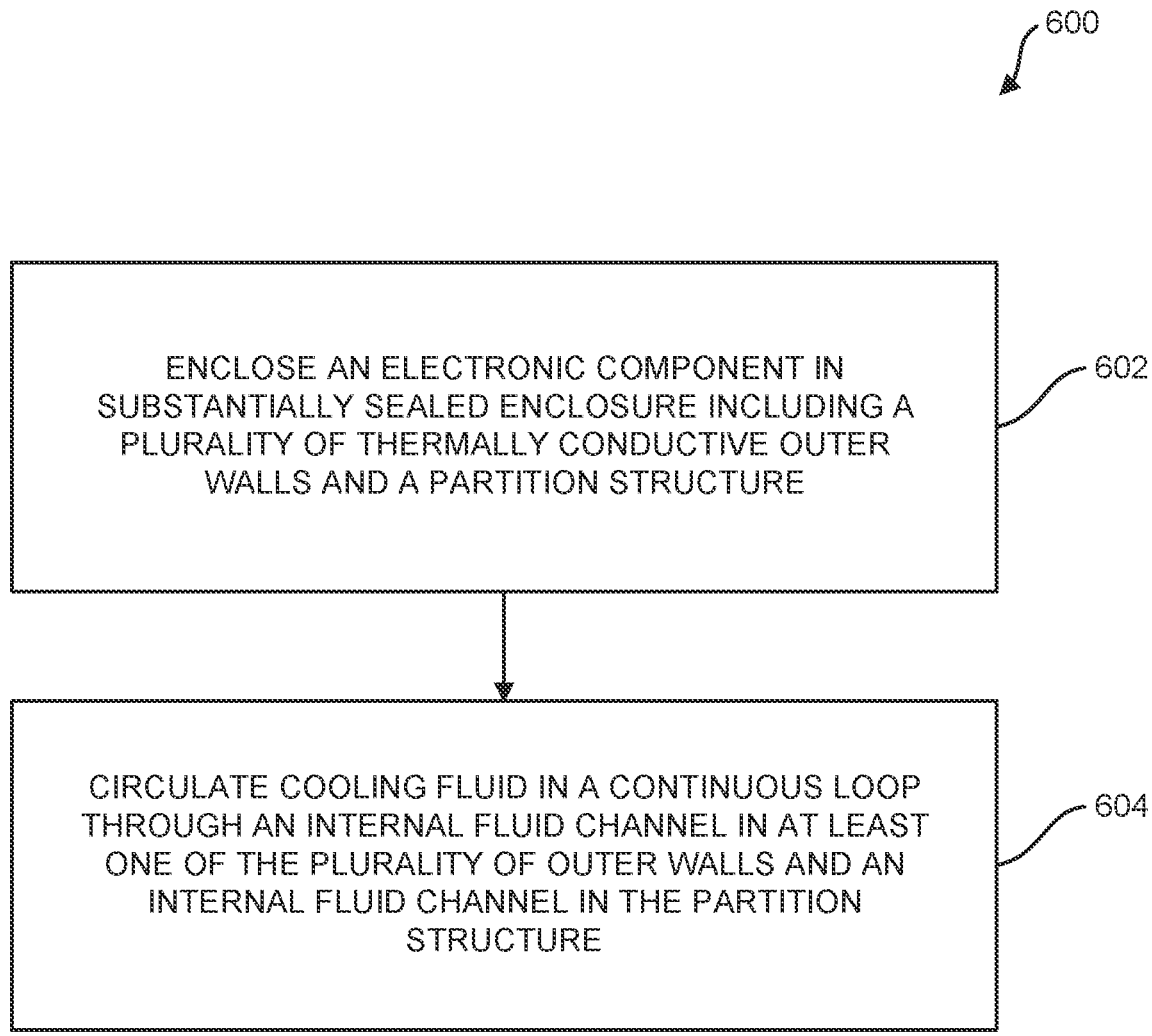
FIG. 6. is a flow diagram depicting a method for enclosing an electronic component in accordance with one example or more examples of the present disclosure.

FIG. 6 is a flow diagram depicting a method 600 for enclosing an electronic component in accordance with one example. As shown in FIG. 6, block 602 represents enclosing an electronic component in a substantially sealed enclosure which includes a plurality of thermally-conductive outer walls and a partition structure. Block 604 in FIG. 6 represents circulating cooling fluid in a continuous loop through an internal fluid channel in at least one of the plurality of outer walls and an internal fluid channel in the partition structure.

The above discussion is meant to be illustrative of the principles and various implementations of the present disclosure. Numerous variations and modifications will become apparent to those skilled in the art once the above disclosure is fully appreciated. It is intended that the following claims be interpreted to embrace all such variations and modifications.

What is claimed is:
1. An electronic component enclosure comprising:
a plurality of outer walls, each outer wall comprising a thermally conductive material and an internal fluid channel, internal to the respective outer wall, for circulation of cooling fluid,
at least one partition structure comprising a thermally conductive material and an internal fluid channel, internal to the partition structure, in sealed fluid communication with the internal fluid channel of at least one outer wall of the plurality of outer walls,
wherein the plurality of outer walls are coupled together to at least partially enclose a volume, and the at least one partition structure is disposed within the volume and extends between two of the plurality of outer walls to define at least two compartments configured to respectively house electronic components;

a fluid inflow port in sealed fluid communication with the internal fluid channel of the at least one outer wall of the plurality of outer walls; and a fluid outflow port in sealed fluid communication with the internal fluid channel of the at least one outer wall of the plurality of walls, wherein the internal fluid channels of the plurality of outer walls and the internal fluid channel of the at least one partition structure define at least one fluid circulation path between the fluid inflow port and the fluid outflow port.

2. The electronic component enclosure of claim 1, wherein each of the plurality of outer walls comprises a laminar structure including first and second layers defining the internal fluid channel therebetween, the first layer comprising a first exterior surface of the respective outer wall and the second layer comprising a second exterior surface of the respective outer wall on an opposite side of the respective outer wall from the first exterior surface.

3. The electronic component enclosure of claim 2, wherein the at least one partition structure comprises a laminar structure including first and second layers defining the internal fluid channel therebetween, wherein the internal fluid channel of the at least one partition structure is in sealed fluid communication with the internal fluid channel of the at least one outer wall of the plurality of outer walls.

4. The electronic component enclosure of claim 3, wherein the plurality of outer walls and the at least one partition structure are formed from steel.

5. The electronic component enclosure of claim 1, wherein the at least one partition structure includes at least one connecting portion for establishing a sealed fluid connection between the internal fluid channel of the at least one partition structure and the internal fluid channel of the at least one outer wall.

6. An enclosure system for electronic components, comprising:
a substantially sealed heat-capturing enclosure, the enclosure comprising:
a plurality of outer walls, each outer wall comprising a thermally conductive material and an internal fluid channel, internal to the respective outer wall, for circulation of cooling fluid;
at least one partition structure defining at least one compartment within the plurality of outer walls, the at least one partition structure comprising a thermally conductive material and having an internal fluid channel, internal to the partition structure, in sealed fluid communication with the internal fluid channel of at least one outer wall of the plurality of outer walls,
wherein the plurality of outer walls are coupled together to at least partially enclose a volume, and the at least one partition structure is disposed within the volume and extends between two of the plurality of outer walls to define at least two compartments configured to respectively house electronic components;
a fluid inflow port in sealed fluid communication with the internal fluid channel of the at least one outer wall of the plurality of outer walls; and
a fluid outflow port in sealed fluid communication with the internal fluid channel of at least one outer wall of the plurality of outer walls, wherein the internal fluid channels of the plurality of outer walls and the internal fluid channel of the at least one partition structure defines at least one fluid circulation path between the fluid inflow port and the fluid outflow port; and a heat exchanger coupled to the fluid inflow port and the fluid outflow port of the enclosure, the heat exchanger to circulate cooling fluid through the at least one fluid circulation path.

7. The enclosure system of claim 6, wherein each outer wall of the plurality of outer walls comprises a laminar structure including first and second layers defining the internal fluid channel therebetween, the first layer comprising a first exterior surface of the respective outer wall and the second layer comprising a second exterior surface of the respective outer wall on an opposite side of the respective outer wall from the first exterior surface.

8. The enclosure system of claim 7, wherein the at least one partition structure comprises a laminar structure including first and second layers defining the internal fluid channel therebetween, wherein the internal fluid channel of the at least one partition structure is in sealed fluid communication with the internal fluid channel of the at least one outer wall of the plurality of outer walls.

9. The enclosure system of claim 8, wherein the plurality of outer walls and the at least one partition structure are formed from steel.

10. The enclosure system of claim 6, wherein the at least one partition structure includes at least one connecting portion for establishing a sealed fluid connection between the internal fluid channel of the at least one partition structure and the internal fluid channel of the at least one outer wall of the plurality of outer walls.

11. A method of capturing heat from an electronic component, comprising:
enclosing the electronic component in a substantially sealed enclosure including a plurality of outer walls and at least one partition structure defining at least one compartment within the enclosure, wherein the plurality of outer walls are coupled together to at least partially enclose a volume, and the at least one partition structure is disposed within the volume and extends between two of the plurality of outer walls to define at least two compartments one of which encloses the electronic component; and
circulating cooling fluid in at least one loop through an internal fluid channel in each of the outer walls and an internal fluid channel in the at least one partition structure, the fluid channel in the at least one partition structure being in sealed fluid communication with the internal fluid channel of at least one outer wall of the plurality of outer walls, wherein for each of the outer walls the internal fluid channel is internal to the respective outer wall and the internal fluid channel of the at least one partition structure is internal to the at least one partition structure.

12. The method of claim 11, further comprising:
forming each outer wall of the plurality of outer walls as a laminar structure including first and second layers defining the internal fluid channel therebetween, the first layer comprising a first exterior surface of the respective outer wall and the second layer comprising a second exterior surface of the respective outer wall on an opposite side of the respective outer wall from the first exterior surface.

13. The method of claim 12, further comprising:
forming the at least one partition structure as a laminar structure including first and second layers defining the internal fluid channel therebetween.

14. The method of claim 13, further comprising:
forming the plurality of outer walls and the at least one partition structure from steel.

15. The method of claim 14, further comprising:
photo-etching at least one of the first and second layers of each outer wall of the plurality of outer walls to form the internal fluid channels of the plurality of outer walls; and
photo-etching at least one of the first and second layers of the at least one partition structure to form the internal fluid channel of the at least one partition structure.

16. The electronic component enclosure of claim 1,
wherein each of the plurality of outer walls comprises a first surface facing into the volume and a second surface, opposite the first surface, facing outside the enclosure, and the internal fluid channel of the respective outer wall is disposed between the first and second surfaces of the respective outer wall; and
wherein the at least one partition structure comprises a first surface facing into one of the at least two compartments and a second surface, opposite the first surface, facing into another of the at least two compartments, and the internal fluid channel of the at least one partition structure is disposed between the first and second surfaces of the at least one partition structure.

17. An enclosure system of claim 6,
wherein each of the plurality of outer walls comprises a first surface facing into the volume and a second surface, opposite the first surface, facing outside the enclosure, and the internal fluid channel of the respective outer wall is disposed between the first and second surfaces of the respective outer wall; and
wherein the at least one partition structure comprises a first surface facing into one of the at least two compartments and a second surface, opposite the first surface, facing into another of the at least two compartments, and the internal fluid channel of the at least one partition structure is disposed between the first and second surfaces of the at least one partition structure.

18. The method of claim 11,
wherein each of the plurality of outer walls comprises a first surface facing into the volume and a second surface, opposite the first surface, facing outside the enclosure, and the internal fluid channel of the respective outer wall is disposed between the first and second surfaces of the respective outer wall; and
wherein the at least one partition structure comprises a first surface facing into one of the at least two compartments and a second surface, opposite the first surface, facing into another of the at least two compartments, and the internal fluid channel of the at least one partition structure is disposed between the first and second surfaces of the at least one partition structure.

* * * * *